United States Patent
Gratzl et al.

(10) Patent No.: US 10,560,203 B2
(45) Date of Patent: Feb. 11, 2020

(54) MEASUREMENT SYSTEM AND METHOD FOR SPURIOUS FREQUENCY DETERMINATION

(71) Applicant: Rohde & Schwarz GmbH & Co. KG, Munich (DE)

(72) Inventors: Robert Gratzl, Dorfen Stadt (DE); Hendrik Bartko, Unterhaching (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/028,726

(22) Filed: Jul. 6, 2018

(65) Prior Publication Data

US 2020/0014471 A1    Jan. 9, 2020

(51) Int. Cl.
H04B 17/00 (2015.01)
H04B 17/10 (2015.01)
G01R 29/08 (2006.01)
G01R 29/10 (2006.01)

(52) U.S. Cl.
CPC ....... H04B 17/104 (2015.01); G01R 29/0878 (2013.01); G01R 29/10 (2013.01)

(58) Field of Classification Search
CPC .............. H04B 17/104; G01R 29/0878; G01R 29/0821; G01R 29/105
USPC .......... 455/67.13, 67.11, 67.14, 115.1, 115.2
See application file for complete search history.

(56) References Cited

U.S. PATENT DOCUMENTS

| | | | |
|---|---|---|---|
| 5,524,281 A * | 6/1996 | Bradley | G01R 27/28 324/601 |
| 7,925,253 B2 * | 4/2011 | Breit | G01R 29/105 455/226.1 |
| 8,103,470 B2 * | 1/2012 | Teshirogi | G01R 29/0821 702/76 |
| 8,912,804 B2 * | 12/2014 | Olgaard | G01R 31/2841 324/633 |
| 8,995,517 B2 * | 3/2015 | Delforce | H04B 17/0085 375/220 |
| 9,692,530 B2 * | 6/2017 | O'Keeffe | H01Q 21/24 |
| 9,906,315 B1 * | 2/2018 | Bartko | H04B 17/102 |
| 2001/0052779 A1 | 12/2001 | Okazaki | |
| 2014/0347079 A1 * | 11/2014 | Min | G01R 31/001 324/750.01 |
| 2015/0054687 A1 * | 2/2015 | Reed | H04B 17/0085 342/361 |
| 2015/0288371 A1 * | 10/2015 | Prummel | H03L 7/1075 327/159 |

OTHER PUBLICATIONS

IEC, "Methods of measurement of disturbances and immunity—Radiated disturbance measurements", IEC, International Standard, CISPR 16-2-3, Edition 3.0, Apr. 2010.

* cited by examiner

Primary Examiner — Sonny Trinh
(74) Attorney, Agent, or Firm — Potomac Technology Law, LLC

(57) ABSTRACT

A measurement system is provided. The measurement system includes a device under test (DUT), an antenna, and a measuring device connected to the antenna. The measuring device is configured to scan for spurious emissions of the DUT for at least one frequency. The measuring device is further configured to determine at least one spurious frequency. The measuring device is further configured to perform a measurement at each of the at least one spurious frequency.

16 Claims, 5 Drawing Sheets

MEASUREMENT SYSTEM AND METHOD FOR SPURIOUS FREQUENCY DETERMINATION

TECHNICAL FIELD

The invention relates to a measurement system and a corresponding measurement method for spurious frequency determination, such as in a two-stage manner.

BACKGROUND

Generally, in times of an increasing number of applications providing wireless communication capabilities, there is a growing need of a measurement system and a corresponding measurement method for verifying correct functioning of the applications in a highly accurate and efficient manner.

The document US20010052779A1 relates principally to an electromagnetic radiation measuring apparatus and its electromagnetic radiation measuring method for measuring the strength of radiation emanating from electronic equipment, and more particularly, to an electromagnetic radiation measuring apparatus and its electromagnetic radiation measuring method suited for measuring an electromagnetic radiation of over 1 GHz. As it can be seen, due to the fact that neither the electromagnetic radiation measuring apparatus nor the corresponding measuring method take account of any spurious frequency, the usage of the apparatus or method, respectively, disadvantageously leads to a limited accuracy, and thus also to a reduced efficiency.

What is needed, therefore, is a measurement approach for spurious frequency determination that ensures both a high accuracy and an increased efficiency.

SOME EXAMPLE EMBODIMENTS

Embodiments of the present invention advantageously address the foregoing requirements and needs, as well as others, by providing a measurement system and a corresponding measurement method for spurious frequency determination that ensure both a high accuracy and an increased efficiency.

According to a first aspect of the invention, a measurement system is provided. The measurement system comprises a device under test, an antenna and a measurement equipment connected to the antenna. In this context, the measurement equipment is configured to scan for spurious emissions for at least one frequency, wherein the measurement equipment is further configured to determine at least one spurious frequency, and wherein the measurement equipment is further configured to perform a detailed measurement at each of the at least one spurious frequency. Advantageously, in this manner, a high accuracy and an increased efficiency can be ensured. Further advantageously, a frequency drift can be detected. For example, such a frequency drift may be a parasitic frequency, such as an erratic and/or dynamic parasitic frequency. In this context, such a frequency drift may occur before, such as immediately before, the detailed measurement is performed.

According to a first implementation form of the provided measurement system, the measurement system further comprises a turntable for positioning the device under test, wherein the measurement equipment is further configured to scan for spurious emissions for at least one turntable position. Advantageously, measurement accuracy can thereby be further increased.

According to a further implementation form of the provided measurement system, the measurement system further comprises a holder for attaching the antenna in a movable manner with respect to height, wherein the measurement equipment is further configured to scan for spurious emissions for at least one holder position. Advantageously, measurement errors can thereby be further reduced.

According to a further implementation form of the provided measurement system, the measurement equipment is further configured to vary respective frequency differences with respect to the at least one frequency. Advantageously, measurement accuracy and efficiency can thereby be further increased. For example, the frequency of the subsequent step may be 15 percent, or 10 percent, or 5 percent, higher or lower than the current frequency.

According to a further implementation form of the provided measurement system, the measurement equipment is further configured to vary respective turntable position differences with respect to the at least one turntable position. Advantageously, measurement accuracy and efficiency can thereby be further increased. For example, the rotation angle of the subsequent step may be 10 degrees, or 20 degrees, or 30 degrees, higher or lower than the current rotation angle.

According to a further implementation form of the provided measurement system, the measurement equipment is further configured to vary respective holder position differences with respect to the at least one holder position. Advantageously, measurement accuracy and efficiency can thereby be further increased. For example, the antenna height of the subsequent step may be 5 centimeters, or 10 centimeters, or 20 centimeters, higher or lower than the current antenna height.

According to a further implementation form of the provided measurement system, the measurement equipment is further configured to determine a maximum spurious frequency with respect to the at least one spurious frequency. Advantageously, for example, efficiency can thereby be further increased.

According to a further implementation form of the provided measurement system, the measurement equipment is further configured to compare the at least one spurious frequency to at least one predefined limit value. For example, the at least one spurious frequency can be compared to at least one respective value of a certain standard, such as the CISPR 22 standard or the EN 55022 standard.

According to a further implementation form of the provided measurement system, the measurement equipment is further configured to compare the maximum spurious frequency to a predefined limit value. For example, the maximum spurious frequency can be compared to a respective value of a certain standard, such as the CISPR 22 standard or the EN 55022 standard.

According to a second aspect of the invention, a measurement method is provided. The measurement method comprises the steps of scanning for spurious emissions for at least one frequency with respect to a device under test with the aid of a measurement equipment connected to an antenna, determining at least one spurious frequency with the aid of the measurement equipment, and performing a detailed measurement at each of the at least one spurious frequency with the aid of the measurement equipment. Advantageously, in this manner, a high accuracy and an increased efficiency can be ensured. Further advantageously, a frequency drift can be detected. For example, such a frequency drift may be a parasitic frequency, such as an erratic and/or dynamic parasitic frequency. In this context, such a frequency drift may occur before, such as immediately before, the detailed measurement is performed.

According to a first implementation form of the provided measurement method, the measurement method further comprises the steps of positioning the device under test with the aid of a turntable, and scanning for spurious emissions for at least one turntable position with the aid of the measurement equipment. Advantageously, measurement accuracy can thereby be further increased.

According to a further implementation form of the provided measurement method, the measurement method further comprises the steps of attaching the antenna to a holder in a movable manner with respect to height, and scanning for spurious emissions for at least one holder position with the aid of the measurement equipment. Advantageously, measurement errors can thereby be further reduced.

According to a further implementation form of the provided measurement method, the measurement method further comprises the step of varying respective frequency differences with respect to the at least one frequency. Advantageously, measurement accuracy and efficiency can thereby be further increased. For example, the frequency of the subsequent step may be 15 percent, or 10 percent, or 5 percent, higher or lower than the current frequency.

According to a further implementation form of the provided measurement method, the measurement method further comprises the step of varying respective turntable position differences with respect to the at least one turntable position. Advantageously, measurement accuracy and efficiency can thereby be further increased. For example, the rotation angle of the subsequent step may be 10 degrees, or 20 degrees, or 30 degrees, higher or lower than the current rotation angle.

According to a further implementation form of the provided measurement method, the measurement method further comprises the step of varying respective holder position differences with respect to the at least one holder position. Advantageously, measurement accuracy and efficiency can thereby be further increased. For example, the antenna height of the subsequent step may be 5 centimeters, or 10 centimeters, or 20 centimeters, higher or lower than the current antenna height.

According to a further implementation form of the provided measurement method, the measurement method further comprises the step of determining a maximum spurious frequency with respect to the at least one spurious frequency. Advantageously, for example, efficiency can thereby be further increased.

According to a further implementation form of the provided measurement method, the measurement method further comprises the step of comparing the at least one spurious frequency to at least one predefined limit value. For example, the at least one spurious frequency can be compared to at least one respective value of a certain standard, such as the CISPR 22 standard or the EN 55022 standard.

According to a further implementation form of the provided measurement method, the measurement method further comprises the step of comparing the maximum spurious frequency to a predefined limit value. For example, the maximum spurious frequency can be compared to a respective value of a certain standard, such as the CISPR 22 standard or the EN 55022 standard.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Embodiments of the present invention are illustrated by way of example, and not by way of limitation, in the figures of the accompanying drawings, in which like reference numerals refer to similar elements, and in which.

DETAILED DESCRIPTION

A measurement system and a corresponding measurement method for spurious frequency determination, which ensure both a high accuracy and an increased efficiency, are described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

A processor, unit, module or component (as referred to herein) may be composed of software component(s), which are stored in a memory or other computer-readable storage medium, and executed by one or more processors or CPUs of the respective devices. A module or unit may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in a computer memory store.

Figure 1:
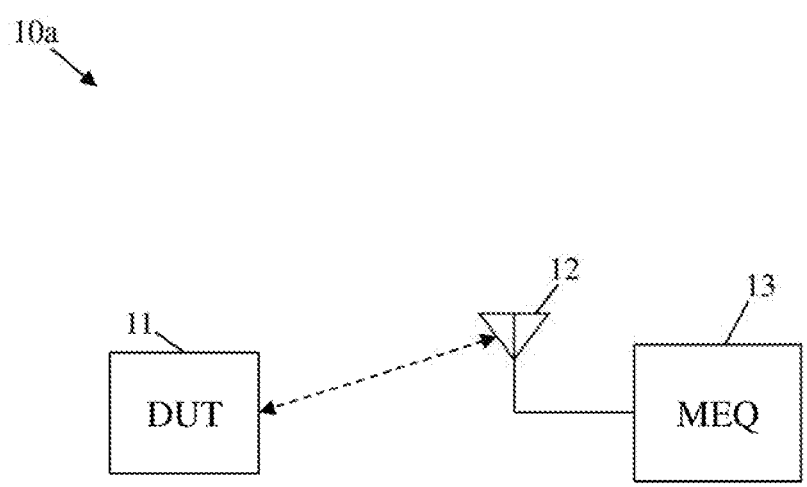
FIG. 1 shows a first example measuring system in accordance with example embodiments of the present invention.

FIG. 1 shows a first example measuring system 10a in accordance with example embodiments of the present invention. The measurement system 10a comprises a device under test 11, an antenna 12 and a measuring device or measurement equipment or measuring device 13 connected to the antenna 12.

By way of example, the measurement equipment 13 is configured to scan for spurious emissions for at least one frequency. Additionally, the measurement equipment 13 may be further configured to determine at least one spurious frequency. In further addition, the measurement equipment 13 may also be configured to perform a detail measurement at each of the at least one spurious frequency.

Figure 2:
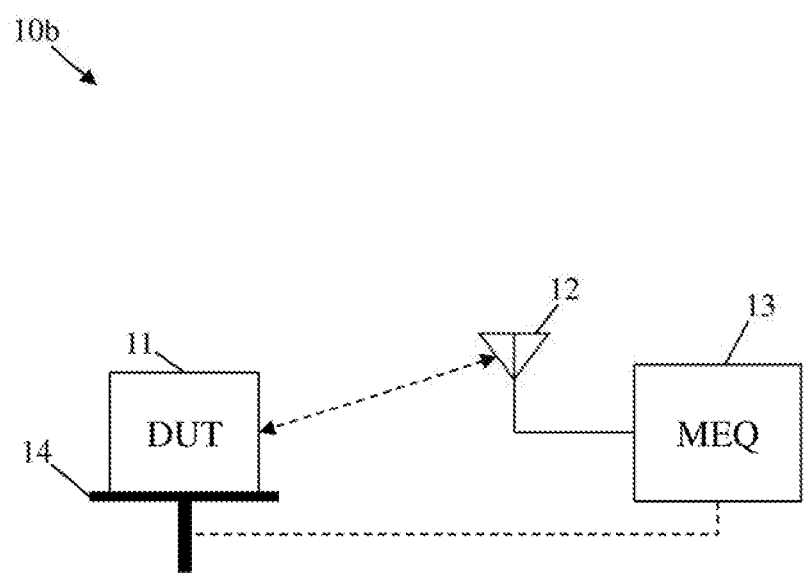
FIG. 2 shows a second example measuring system in accordance with example embodiments of the present invention.

FIG. 2 shows a second example measuring system 10b in accordance with example embodiments of the present invention. With reference to FIG. 2, the respective measurement system 10b is based on the measurement system 10a, and additionally comprises a turntable 14 for positioning the device under test 11. By way of example, the measurement equipment 13 may thereby be further configured to scan for spurious emissions for at least one turntable position.

Figure 3:
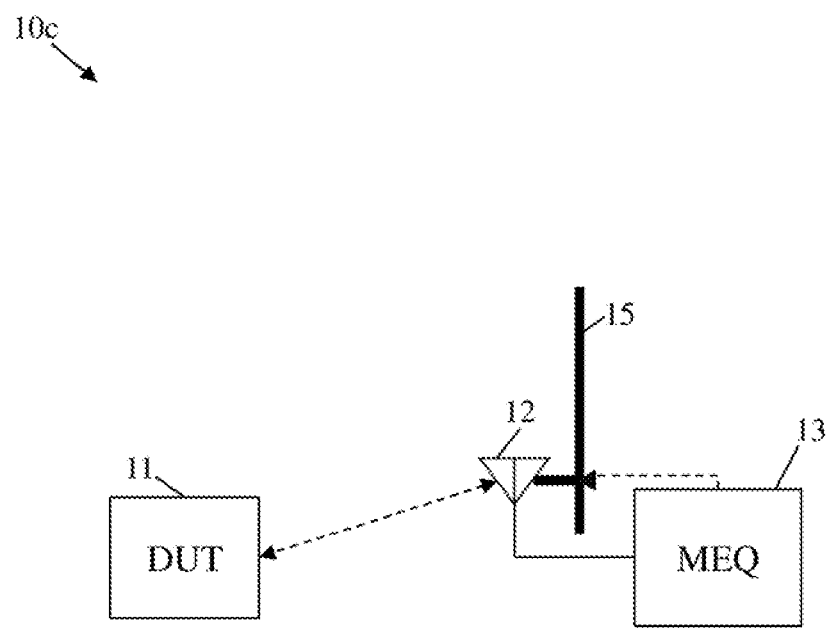
FIG. 3 shows a third example measuring system in accordance with example embodiments of the present invention.

FIG. 3 shows a third example measuring system 10c in accordance with example embodiments of the present invention. With reference to FIG. 3, the respective measurement system 10c is based on the measurement system 10a, and additionally comprises a holder 15 for attaching the antenna 12 in a movable manner with respect to height. By way of example, the measurement equipment 13 may thereby be further configured to scan for spurious emissions for at least one holder position.

Figure 4:
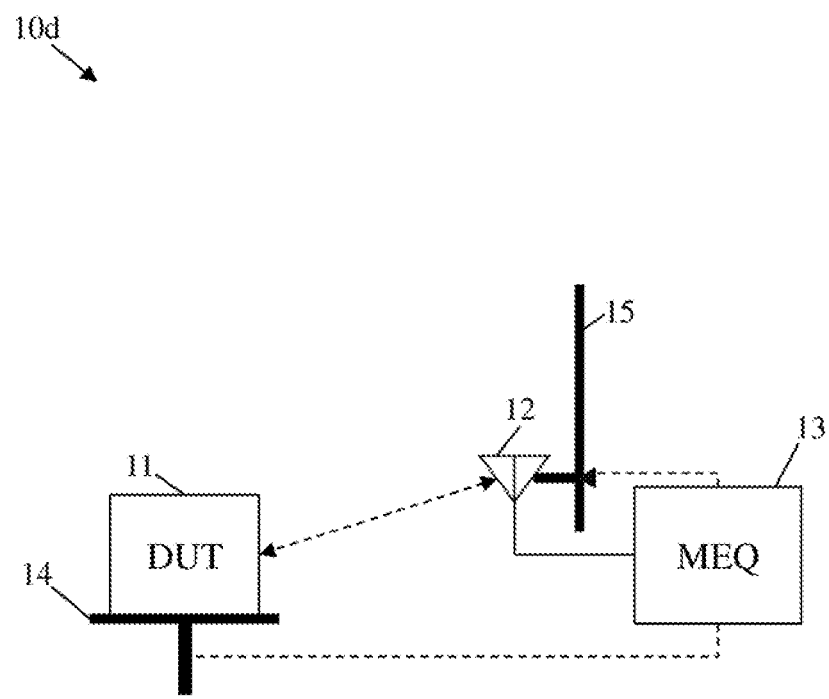
FIG. 4 shows a fourth example measuring system in accordance with example embodiments of the present invention.

FIG. 4 shows a fourth example measuring system 10d in accordance with example embodiments of the present invention. With reference to FIG. 4, the respective measurement system 10d is based on the measurement system 10a, and additionally comprises both the turntable 14 for positioning the device under test 11 and the holder 15 for attaching the antenna 12 in a movable manner with respect to height.

Additionally or alternatively, with respect to each of the four embodiments 10a, 10b, 10c, 10d, the measurement equipment 13 may be further configured to vary respective frequency differences with respect to the at least one frequency.

Further, with respect to the second embodiment 10b (according to FIG. 2) and the fourth embodiment 10d (according to FIG. 4), the measurement equipment 13 may additionally or alternatively be configured to vary respective turntable position differences with respect to the at least one turntable position.

Further, with respect to the third embodiment 10c (according to FIG. 3) and the fourth embodiment 10d (according to FIG. 4), the measurement equipment 13 may additionally or alternatively be configured to vary respective holder position differences with respect to the at least one holder position.

Further, the measurement equipment 13 may additionally or alternatively be configured to determine a maximum spurious frequency with respect to the at least one spurious frequency.

Additionally or alternatively, the measurement equipment 13 may be further configured to compare the at least one spurious frequency to at least one predefined limit value.

Further additionally or alternatively, the measurement equipment 13 may be further configured to compare the maximum spurious frequency to a predefined limit value.

Figure 5:
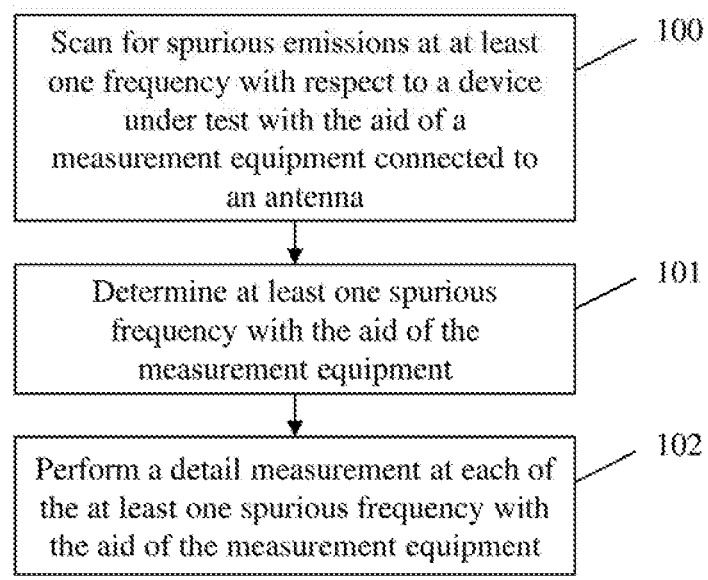
FIG. 5 shows a flow chart of an example measuring method in accordance with example embodiments of the present invention.

FIG. 5 shows a flow chart of an example measuring method in accordance with example embodiments of the present invention. In step 100, the device under test is scanned for spurious emissions for at least one frequency with the aid of a measurement equipment connected to an antenna. In step 101, at least one spurious frequency is determined with the aid of the measurement equipment. In step 102, a detailed measurement is performed at each of the at least one spurious frequency with the aid of the measurement equipment.

The measurement method may further comprise the steps of positioning the device under test with the aid of a turntable, and scanning for spurious emissions for at least one turntable position with the aid of the measurement equipment.

In addition to this or as an alternative, the measurement method may further comprise the steps of attaching the antenna to a holder in a movable manner with respect to height, and scanning for spurious emissions for at least one holder position with the aid of the measurement equipment.

Further, the measurement method may further comprise the step of varying respective frequency differences with respect to the at least one frequency.

Further, the measurement method may further comprise the step of varying respective turntable position differences with respect to the at least one turntable position.

Further, the measurement method may further comprise the step of varying respective holder position differences with respect to the at least one holder position.

In addition to this or as an alternative, the measurement method may comprise the step of determining a maximum spurious frequency with respect to the at least one spurious frequency.

Additionally or alternatively, the measurement method may comprise the step of comparing the at least one spurious frequency to at least one predefined limit value.

In further addition to this or as a further alternative, the measurement method may comprise the step of comparing the maximum spurious frequency to a predefined limit value.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measurement system comprising:
   a device under test (DUT);
   an antenna; and
   a measuring device connected to the antenna; and wherein the measuring device is configured to scan for spurious emissions of the DUT for at least one frequency,
wherein the measuring device is further configured to determine at least one spurious frequency,
wherein the measuring device is further configured to vary respective frequency differences with respect to the at least one frequency,
wherein the measuring device is further configured to perform a measurement at each of the at least one spurious frequency, and
wherein the measuring device is further configured to detect a frequency drift in the form of a parasitic frequency.

2. The measurement system according to claim 1, further comprising:
a turntable configured to move the DUT; and
wherein the measuring device is further configured to scan for spurious emissions of the DUT for at least one turntable position.

3. The measurement system according to claim 2, wherein the measuring device is further configured to vary respective turntable position differences with respect to the at least one turntable position.

4. The measurement system according to claim 1, further comprising:
a holder configured to attach the antenna to the measuring device in a movable manner with respect to height; and
wherein the measuring device is further configured to scan for spurious emissions of the DUT for at least one holder position.

5. The measurement system according to claim 4, wherein the measuring device is further configured to vary respective holder position differences with respect to the at least one holder position.

6. The measurement system according to claim 1, wherein the measuring device is further configured to determine a maximum spurious frequency with respect to the at least one spurious frequency.

7. The measurement system according to claim 6, wherein the measuring device is further configured to compare the maximum spurious frequency to a predefined limit value.

8. The measurement system according to claim 1, wherein the measuring device is further configured to compare the at least one spurious frequency to at least one predefined limit value.

9. A measurement method comprising:
scanning, by a measuring device via an antenna connected to the measuring device, for spurious emissions of a device under test (DUT) for at least one frequency;
determining, by the measuring device, at least one spurious frequency;
varying, by the measuring device, respective frequency differences with respect to the at least one frequency,
performing, by the measuring device, a measurement at each of the at least one spurious frequency; and
detecting, by the measuring device, a frequency drift in the form of a parasitic frequency.

10. The measurement method according to claim 9, further comprising:
positioning the DUT with the aid of a turntable; and
scanning, by the measuring device, for spurious emissions of the DUT for at least one turntable position.

11. The measurement method according to claim 10, further comprising:
varying respective turntable position differences with respect to the at least one turntable position.

12. The measurement method according to claim 9, further comprising:
positioning the antenna with the aid of a holder configured to attach the antenna to the measuring device in a movable manner with respect to height; and
scanning, by the measuring device, for spurious emissions of the DUT for at least one holder position.

13. The measurement method according to claim 12, further comprising:
varying respective holder position differences with respect to the at least one holder position.

14. The measurement method according to claim 9, further comprising:
determining a maximum spurious frequency with respect to the at least one spurious frequency.

15. The measurement method according to claim 14, further comprising:
comparing the maximum spurious frequency to a predefined limit value.

16. The measurement method according to claim 9, further comprising:
comparing the at least one spurious frequency to at least one predefined limit value.

* * * * *